United States Patent [19]

Voegeli

[11] 4,058,801
[45] Nov. 15, 1977

[54] FIELD ACCESS METHOD FOR BUBBLE MEMORIES

[75] Inventor: Otto Voegeli, San Jose, Calif.

[73] Assignee: International Business Machines Corporation, Armonk, N.Y.

[21] Appl. No.: 692,259

[22] Filed: June 3, 1976

[51] Int. Cl.² .................. G11C 11/14; G11C 19/00
[52] U.S. Cl. ............................ 365/39; 365/2; 365/6; 365/19
[58] Field of Search ............... 340/174 NA, 174 MA, 340/174 ZB, 174 BC, 174 S, 174 TF, 174 OA

[56] References Cited

U.S. PATENT DOCUMENTS

| 3,534,347 | 10/1970 | Bobeck | 340/174 TF |
| 3,541,534 | 11/1970 | Bobeck et al. | 340/174 SR |
| 3,603,939 | 9/1971 | Bobeck et al. | 340/174 TF |
| 3,797,001 | 3/1974 | Chen et al. | 340/174 TF |
| 3,825,885 | 7/1974 | Hendel et al. | 340/174 TF |

*Primary Examiner*—Vincent P. Canney
*Attorney, Agent, or Firm*—Joseph E. Kieninger

[57] ABSTRACT

Field access system for use in propagation of bubbles is disclosed. The field access system combines discrete drive elements with a continuous drive film. An example is a Permalloy overlay consisting of a continuous drive film with protruding T & I bars which function as drive elements. This overlay structure is spaced over a suitable bubble material. The drive film is in direct contact with the T & I drive elements so that exchange coupling exists between the drive film and the drive elements. Use of a continuous drive film allows for control of the drive elements by a closed flux magnetic circuit having low power consumption.

14 Claims, 7 Drawing Figures

FIELD ACCESS METHOD FOR BUBBLE MEMORIES

FIELD OF THE INVENTION

This invention relates to propagation arrangements for magnetic bubbles and more particularly to field access systems.

BRIEF DESCRIPTION OF PRIOR ART

Bubble domains have been translated by a propagation scheme generally known as field accessing. Field accessing propagation modes are described in the patent to Bobeck 3,534,347, Bobeck et al, 3,541,534, Chen et al, 3,797,001, as well as others. The term "field access" characterizes a method which utilizes patterns of soft magnetic elements which are located on top of the domain layer. The elements are of geometries to exhibit magnetic poles in the presence of a magnetic field in the plane of the domain layer. Moreover, the elements are disposed such that poles are produced in consecutively offset patterns in response to reorientations of the in-plane drive field so that the domains are moved from an input to an output position along a channel defined by the elements. With the rotating in-plane drive field, the T and I bar, Y bar or T-X bar geometries are commonly employed for the soft magnetic elements.

Field access arrangements suitable for bubble lattice use are described in copending U.S. patent applications, Ser. No. 604,978 filed on Aug. 15, 1975 and Ser. No. 640,510 filed on Dec. 15, 1975 and assigned to the assignee of the present invention. The field access pattern described in the first application contains two sets of parallel oblong elements that are substantially perpendicular to each other and which are located in particular positions with respect to the bubbles in the lattice. The pattern described in the second application contains a set of diamond shaped magnetic elements arranged in a regular array. The elements have two sides which are parallel to one bubble lattice axis and two sides which are parallel to another bubble lattice axis. The bubbles are propagated in the direction of a third bubble lattice axis.

Field access arrangements are particularly inexpensive and reliable because vast numbers of bit locations are defined in a single photolithographic process and no external connections are employed. The onchip power dissipation in field accessing systems is substantially less than in current conductor access systems. The total power consumption of a field access systems is, however, substantially larger than with a current access system. In a field access system, the power is dissipated in the coils generating the rotating drive field. A field strength of about 50 Oe is typically required to operate the drive elements since the field strength must be sufficient to overcome demagnetization of these discrete elements. Power consumption is large also, because the drive field needs to extend over a large volume to be sufficiently uniform within the chip area.

Field access arrangements also have problems resulting from demagnetized domain configuration in the drive elements. For example, it has been found that smaller Permalloy elements require increased drive fields to overcome demagnetizing effects. In addition bubbles have a tendency to stick to the demagnetized Permalloy elements. These problems become more serious as the size of the bubbles are decreased, that is, the problem is more severe with three micron bubbles than with five or six micron bubbles.

The use of overlay films in bubble devices for hard bubble suppression and to extend the stability of range of bubbles versus the bias field is disclosed in the patents to Bobeck et al 3,603,939 and the patents to Hendel et al 3,825,885 and in the Hidaka et al article in the 3M Proceedings, pp. 633–644 (1974). These articles describe a structure having a thin Permalloy film of the order of about 300 angstroms which is in contact with the bubble material and is in spaced relationship with the discrete drive elements.

SUMMARY OF THE INVENTION

It is the primary of this invention to provide an improved bubble propagation mode.

It is another object of this invention to provide a field access system having reduced power consumption.

It is still another object of this invention to provide a field access system having a uniform state of magnetization in each drive element.

It is yet still another object of this invention to provide a bubble translation scheme that is suitable for use with bubbles having a diameter of less than three microns.

It is a further object of this invention to provide a field access system which, in its entirety can be fabricated on the bubble chip.

These and other objects are accomplished by field access system having a continuous drive film in contact with the drive elements. The continuous drive film is in spaced relationship with the film of bubble material. A rotating drive field is applied to the continuous drive film which, in a preferred arrangement, is part of a closed flux magnetic drive circuit. An exchange interaction between the continuous drive film and the drive elements controls the operation of each drive element by imposing in each drive element the same uniform direction of magnetization as exists in the drive film.

Other objects of this invention will be apparent from the following detailed description, reference being made to the accompanying drawings wherein various embodiments of the invention are shown.

DESCRIPTION OF THE ILLUSTRATIVE EMBODIMENTS

Figure 1:
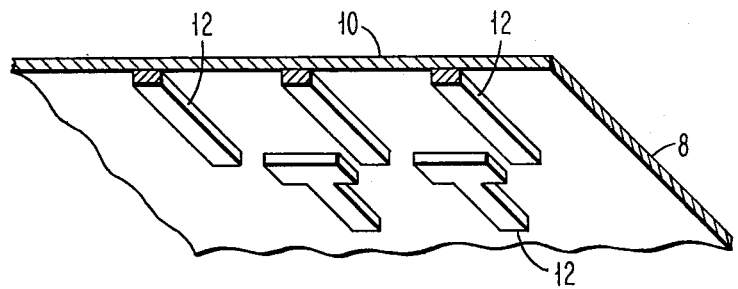
FIG. 1 is a cross sectional view showing the drive film and drive elements.

As shown in FIG. 1, the overlay 8 contains a continuous drive film 10 which is in contact with drive elements 12. The continuous drive film is a soft magnetic material such as a Permalloy material and has a thickness of about 0.2 to 0.4 $\mu$um. Similarly, the drive elements are typically soft material magnetic materials such as a Permalloy material. The drive elements 12 shown in FIG. 1 are T & I bar elements. The drive elements 12 may be any of the geometries commonly employed in field accessed bubble devices or have the geometry described in the copending field access patent applications referred to in the prior art. Each discrete drive element 12 is not driven through an interaction with an applied drive field but is driven through an exchange interaction with the continuous drive film 10. As a result there is the same uniform state of magnetization in each drive element 12 as exists in the drive film 10 and very little power is required to rotate the magnetization in the plane of the geometrically isotropic drive film 10. This overlay structure in FIG. 1 consisting of film 10 and drive element 12 are superimposed and spaced from a suitable bubble material.

In the operation of overlay 8 some external provisions exist which uniformly rotate the drive film magnetization in the film 10. A rotating drive field (not shown) generated through an orthogonal set of drive coils such as is used in conventional bubble memories may be used. A field strength of less than 10 Oe typically suffices to rotate the magnetization in the continuous drive film for reliable bubble propagation, whereas a drive field of about 50 Oe would be required to operate discrete drive elements without use of a drive film.

Figure 2:
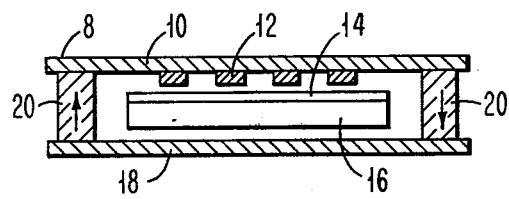
FIG. 2 is a cross sectional view of a field access pattern in accordance with this invention.
Figure 3:
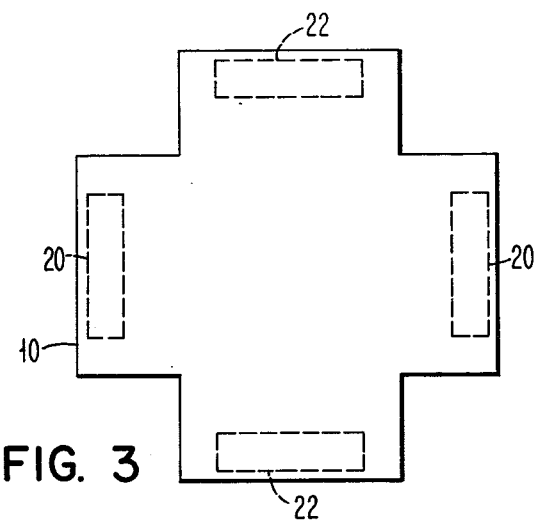
FIG. 3 is a top view of FIG. 2.
Figure 5:
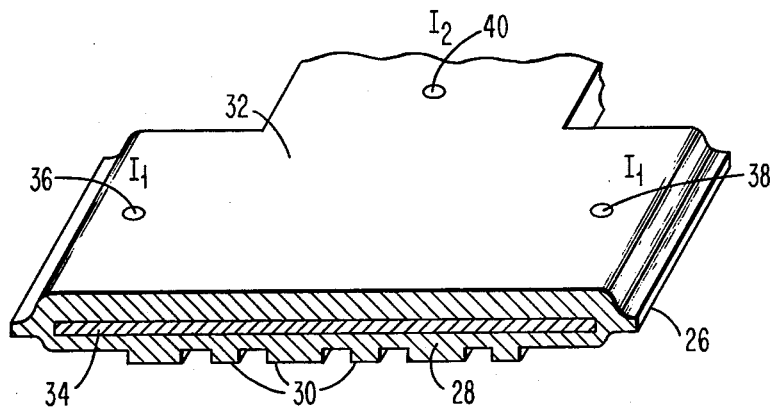
FIG. 5 is a cross sectional view of closed flux drive arrangement fabricated in its entirety on the bubble chip.

A preferred drive arrangement is shown in FIGS. 2, 3 and 5 where the drive film forms part of a closed flux magnetic circuit to further reduce power consumption. In FIGS. 2 and 3 the overlay 8 consisting of the drive film 10 and the drive element 12 are positioned over a bubble film 14 which is on a substrate 16. Below the substrate 16 is a yoke 18 which is parallel to the overlay 8. The drive field is supplied by two pairs of drive magnets 20 and 22 as shown in FIG. 3. A magnetic potential is applied by a current conductor (not shown) around both pairs of drive magnets 20 and 22.

When the magnetization drive film rotates in response to 90° shifted magnetic potentials from the two pairs of drive magnets, the exchange coupled magnetization of each drive element rotates in unison along the drive film magnetization. Stray films from the uniformly magnetized drive elements interact with the domains in the bubble material so as to propagate these domains in the conventional manner along a chain of drive elements.

Domain propagation in accordance with this invention is similar to conventional bubble memories. The interaction mechanism between the drive element in the domain is not the same as method as in conventional bubble memories. In conventional bubble memories, the aspect ratio of a drive element governs its degree of magnetization as a function of drive field orientation and in turn the stray field seen by the bubble domain. In accordance with this invention all drive elements remain uniformly magnetized and the aspect ratio of a drive element only serves to make the strength of its dipole moment a function of the magnetization direction.

Use of a continuous drive film is particularly useful with small bubbles having a diameter of less than three microns. The magnetization in a continuous Permalloy film, because of exchange in magnetostatic coupling, tries to remain uniform at least over distances of less than about two microns as is well known in the art. When the dimensions of the drive elements are less than this coupling distance, the local permeability of the drive film becomes very small and shunting of stray flux originating from bubbles and drive elements is neglible. As a result this system is primarily useful with small bubbles.

Figure 4A:
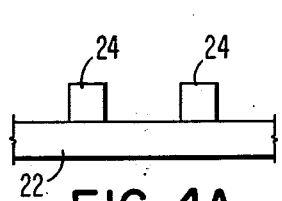
FIGS. 4a–c are cross sectional views in the fabrication process of the drive film-drive element structure.
Figure 4B:
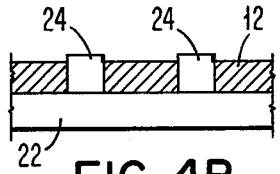
Figure 4C:
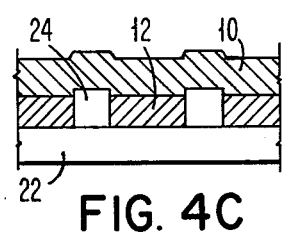

FIGS. 4A-C illustrate one method of fabricating the disclosed structure. A photoresist pattern 24 is first deposited on an adhesive conduction layer 22. The Permalloy drive elements 12 are then electroplated on the conduction layer 22 as shown in FIG. 4B. The uniform drive film is then vacuum deposited on top of drive elements 10 and photoresist pattern 24.

While the structure shown in FIGS. 1 through 4 have the drive film on top of the drive elements, this invention includes the overlay in which the drive elements are on top of the drive film. This latter embodiment is not as efficient but can be more simply fabricated by the same deposition technique.

A closed flux magnetic circuit drive arrangement embodiment as shown in FIG. 5 is fabricated in its entirety on the bubble chip. The overlay 26 contains a continuous drive film 28 which is in contact with drive elements 30. A yoke 32 is connected to the ends of drive film 28. The main portion of yoke 32 is separated from the drive film 28 by a drive conductor 34. The drive conductor 34 is activated by drive currents $I_1$, which flows through leads 36 and 38 and by drive currents $I_2$, 90° out of phase to $I_1$, which flows through lead 40 and another lead (not shown). The currents $I_1$ and $I_2$ flow in orthogonal directions through the drive conductor 34. This embodiment has several advantages, namely the ease of fabrication as well as simplification of the package design.

Although several preferred embodiments of this invention have been described, it is understood that numerous variations may be made in accordance with the principles of this invention.

I claim:

1. A field access system for magnetic bubble domains comprising:
    a sheet of magnetic material in which bubble domains can exist,
    a drive film of magnetically soft material in spaced relationship with said sheet, and
    drive elements of magnetically soft material in contact with said drive film wherein said drive elements are driven through an exchange interaction with said drive film.

2. A field access system as described in claim 1 wherein said drive film has a thickness greater than 0.2 microns.

3. A field access system as described in claim 1 wherein said drive film has a thickness of from 0.2 to 0.4 microns.

4. A field access system as described in claim 1 wherein said drive film remains uniformly magnetized.

5. A field access system as described in claim 1 wherein said drive elements are positioned between said sheet and said drive film and in spaced relationship with said sheet.

6. A field access system as described in claim 1 wherein said drive film is positioned between said drive elements and said sheet.

7. A field access system for magnetic bubble domains comprising:
    a sheet of magnetic material in which bubble domains can exist,
    a drive film of magnetically soft material in spaced relationship with said sheet,
    drive elements of magnetically soft material in contact with said drive film wherein said drive elements are driven through an exchange interaction with said drive film, and means for applying a magnetic field to said drive film.

8. A field access system as described in claim 7 wherein said means include a rotating magnetic drive field means.

9. A field access system as described in claim 7 wherein said means includes a pair of drive magnets.

10. A method of switching the magnetization of drive elements in a field access drive system for propagating bubbles in a sheet of magnetic material comprising the steps of:
   providing a drive film of magnetically soft material in contact with drive elements, said drive film being in spaced relationship to said sheet of magnetic material and
   applying a magnetic field to said drive film.

11. A field access system for magnetic bubble domains comprising:
   a sheet of magnetic material in which bubble domains can exist,
   a drive film of magnetically soft material in spaced relationship with said sheet,
   drive elements of magnetically soft material in contact with said drive film wherein said drive elements are driven through an exchange interaction with said drive film,
   means for applying a magnetic field to said drive film, and
   yoke means associated with said drive film.

12. A field access system as described in claim 11 wherein said yoke means is positioned on one side of said sheet and said film is positioned on the opposite side of said sheet.

13. A field access system as described in claim 11 wherein said yoke means and said film are positioned on the same side of said sheet.

14. A field access system as described in claim 13 wherein a portion of said yoke means is separated from said film by a conductor.

* * * * *